United States Patent
Kaneko et al.

(10) Patent No.: US 7,824,049 B2
(45) Date of Patent: Nov. 2, 2010

(54) ILLUMINATION DEVICE AND DISPLAY DEVICE INCORPORATING THE SAME

(75) Inventors: Hiroki Kaneko, Hitachinaka (JP); Toshiaki Tanaka, Hitachi (JP); Ikuo Hiyama, Hitachinaka (JP); Hiroshi Sasaki, Mito (JP); Yoshifumi Sekiguchi, Hitachiota (JP)

(73) Assignee: Hitachi Displays, Ltd., Chiba (JP)

( * ) Notice: Subject to any disclaimer, the term of this patent is extended or adjusted under 35 U.S.C. 154(b) by 159 days.

(21) Appl. No.: 11/953,097

(22) Filed: Dec. 10, 2007

(65) Prior Publication Data

US 2008/0137331 A1 Jun. 12, 2008

(30) Foreign Application Priority Data

Dec. 11, 2006 (JP) ............................. 2006-333454

(51) Int. Cl.
*G09F 13/08* (2006.01)

(52) U.S. Cl. ................. 362/97.3; 362/244; 362/311.02; 349/69; 257/100

(58) Field of Classification Search ................ 362/97.3, 362/612, 244, 307, 311.01, 311.02, 97.1–97.2, 362/97.4; 349/69; 257/100
See application file for complete search history.

(56) References Cited

U.S. PATENT DOCUMENTS 5,836,676 A * 11/1998 Ando et al. ................. 362/244
6,069,440 A * 5/2000 Shimizu et al. ............. 313/486
2004/0080938 A1 * 4/2004 Holman et al. ............. 362/231
2005/0127378 A1 6/2005 Suehiro et al.
2006/0092634 A1 * 5/2006 Hiyama et al. ............. 362/231
2006/0138437 A1 * 6/2006 Huang et al. ................. 257/98
2006/0146563 A1 * 7/2006 Chen ......................... 362/561
2006/0227431 A1 * 10/2006 Yoon et al. ................. 359/708
2009/0116216 A1 * 5/2009 Kim et al. .................... 362/84

FOREIGN PATENT DOCUMENTS

JP 7-111342 4/1995
JP 10-65220 3/1998

* cited by examiner

*Primary Examiner*—Robert J May
(74) *Attorney, Agent, or Firm*—Antonelli, Terry, Stout & Kraus, LLP.

(57) ABSTRACT

An illumination device has a plurality of sealing structures each including a light-emitting diode, sealed by a high refractive index transparent material member which is further sealed by a low refractive index transparent material member. To increase a divergence angle of light radiation, the portion of the high refractive index transparent material member which covers an upper surface of the light-emitting diode is structured so as to satisfy a relation $H > (L/2)/\tan\{\sin^{-1}(n_1/n_2)\}$, where H represents a thickness of the high refractive index transparent material member measured at the central portion of the upper surface of the light-emitting diode, L represents the length of one side of the upper surface of the light-emitting diode, $n_1$ represents the refractive index of the high refractive index transparent material member and $n_2$ represents the refractive index of the low refractive index transparent material member.

16 Claims, 11 Drawing Sheets

ILLUMINATION DEVICE AND DISPLAY DEVICE INCORPORATING THE SAME

BACKGROUND OF THE INVENTION

The present invention relates to illumination devices using a light-emitting diode and to display devices in which such illumination device is used as a backlight source for a non-luminous display panel.

With the recent improvement of the light emission efficiency of light-emitting diodes, light sources in various kinds of illumination devices have been changed from lamps or fluorescent lamps to light-emitting diodes. This is because the light-emitting diodes are meritorious in many points, that is, they are smaller in size, are capable of multi-colored light emission, are easily controllable, consume smaller electric power, and so forth. However, the light output and the efficiency of the light-emitting diode are not enough for illumination use in which a large light output is required or for display use in which an illumination device is used as a backlight source of a display panel. Thus, it is required to further increase the output light by improving the efficiency and to lower the power consumption.

As measures for enhancing the efficiency in the light extraction from a light-emitting diode without changing the structure of the light-emitting diode, it is known, for example, from JP-A-10-65220 that a light-emitting diode is sealed with a high refractive index resin and the resulting arrangement is further sealed at its periphery with a low refractive index resin.

SUMMARY OF THE INVENTION

According to the teaching of the above-mentioned JP-A-10-65220, it is possible to enhance the light extraction from the light-emitting diode. However, the extracted light from the light-emitting diode has a high directivity, so that the above invention does not appear to intend uniformity of light intensity on an illumination plane which is a prerequisite for satisfactory operations of an illumination device including a plurality of light-emitting diodes.

An object of the present invention is to provide an illumination device in which the light extraction efficiency is high and the uniformity of light intensity on an illumination plane is high.

Another object of the present invention is to provide a display device incorporating such illumination device.

According to one aspect of the present invention, an illumination device has a plurality of sealing structures each including a light-emitting diode, a high refractive index transparent material member sealing the light-emitting diode and a low refractive index transparent material member sealing the high refractive index transparent material member, in which the portions of the high refractive index transparent member which covers an upper surface of the light-emitting diode serves to increase a divergence angle of light radiation from the light-emitting diode.

According to another aspect of the present invention, an illumination device has at least two selected from a group consisting of a light-emitting diode capable of emitting light in a red wavelength region, a light-emitting diode capable of emitting light in a green wavelength region and a light-emitting diode capable of emitting light in a blue wavelength region, and the at least two light-emitting diodes are sealed by a high refractive index transparent material member so that light therefrom are mixed with each other.

The illumination device and the display device according to some embodiments of the present invention enjoy advantages such that the efficiency of light extraction from a diode is improved, uniformity of light intensity on an illumination plane is enhanced owing to the increase of a divergence angle of light radiation from the diode, and/or the color quality of mixed light is high.

Other objects, features and advantages of the invention will become apparent from the following description of the embodiments of the invention taken in conjunction with the accompanying drawings.

DETAILED DESCRIPTION OF THE EMBODIMENTS

Illumination devices and display devices incorporating such illumination devices according to embodiments of the present invention will now be described with reference to the accompanying drawings.

Embodiment 1

Figure 1:
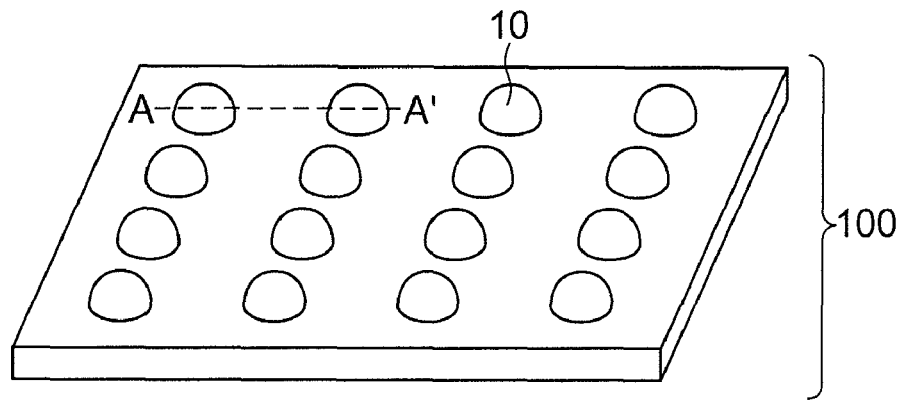
FIG. 1 is a perspective view of an illumination device according to Embodiment 1 of the present invention.
Figure 2:
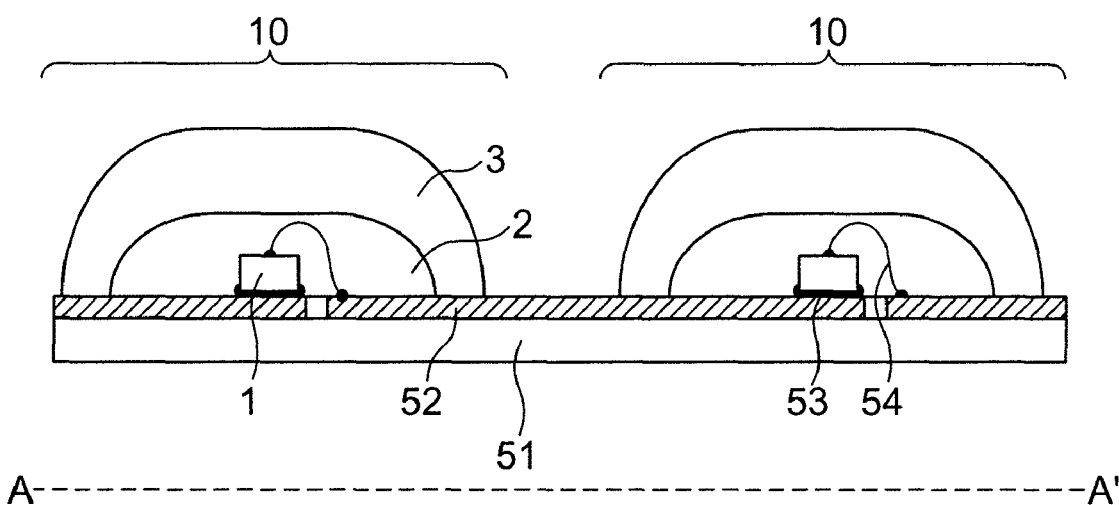
FIG. 2 is a crosssectional view taken along line A-A' in FIG. 1.
Figure 3:
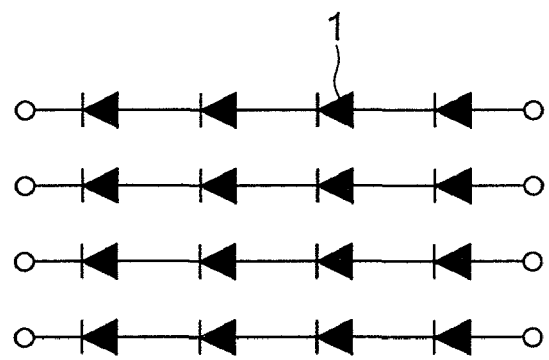
FIG. 3 is an electric circuit diagram in connection with Embodiment 1.
Figure 4:
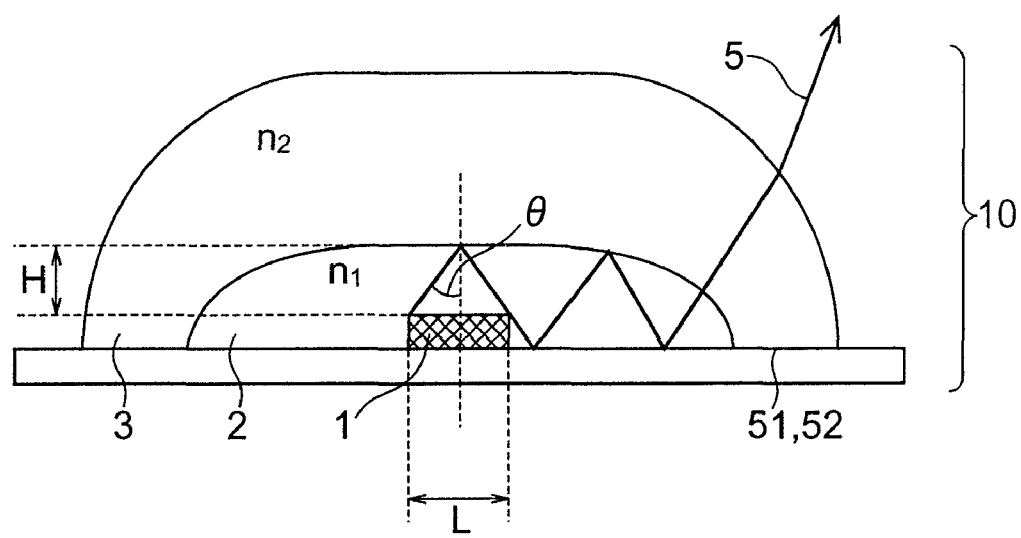
FIG. 4 is a crosssectional view of a sealing structure in Embodiment 1 in which travel of light is illustrated.
Figure 5A:
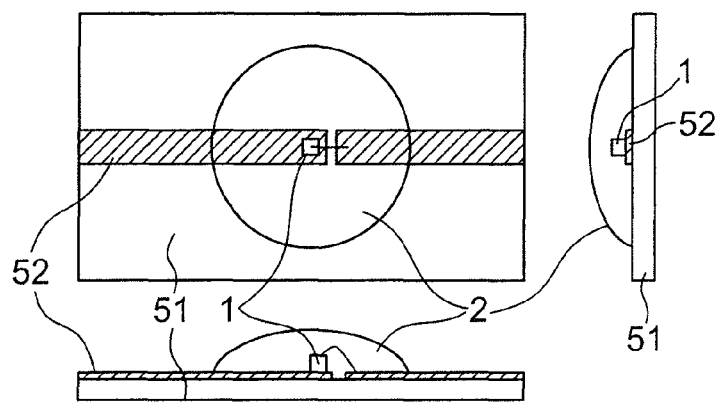
FIGS. 5A to 5C show in plan and crosssectional views examples of the shape of a high refraction index material member in a sealing structure.
Figure 5B:
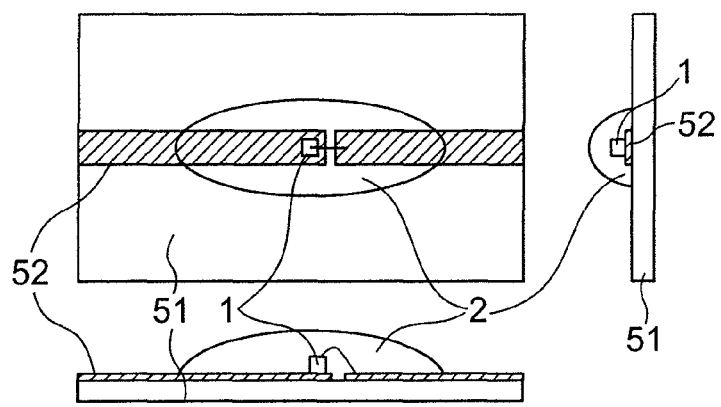
Figure 5C:
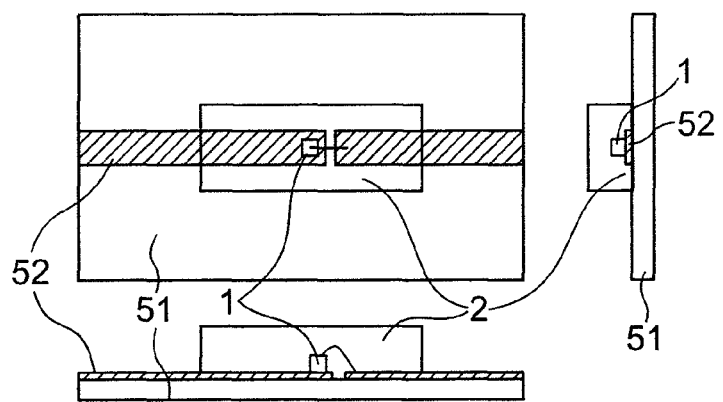
Figure 6A:
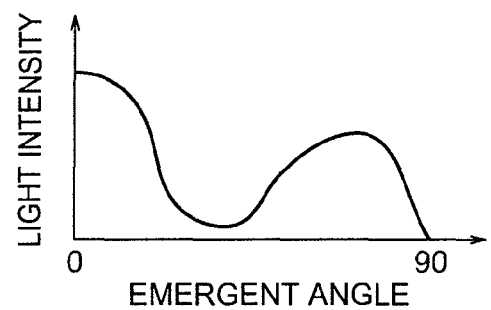
FIG. 6A is a diagram of distribution of light intensity with respect to the emergent angle in a horizontal direction.
Figure 6B:
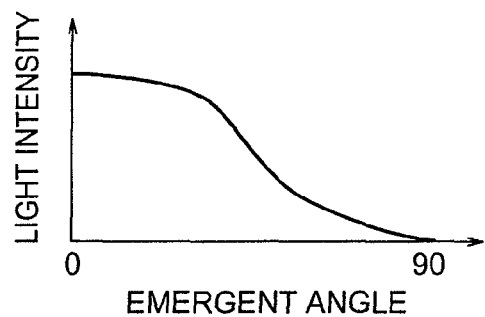
FIG. 6B is a diagram of distribution of light intensity with respect to the emergent angle in a vertical direction.
Figure 7A:
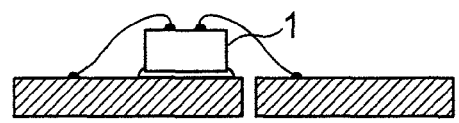
FIGS. 7A and 7B are structural diagrams of examples of light-emitting diodes.
Figure 7B:
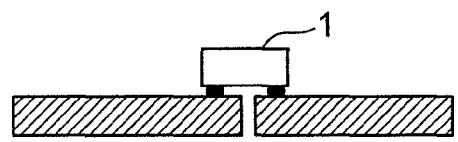
Figure 8A:
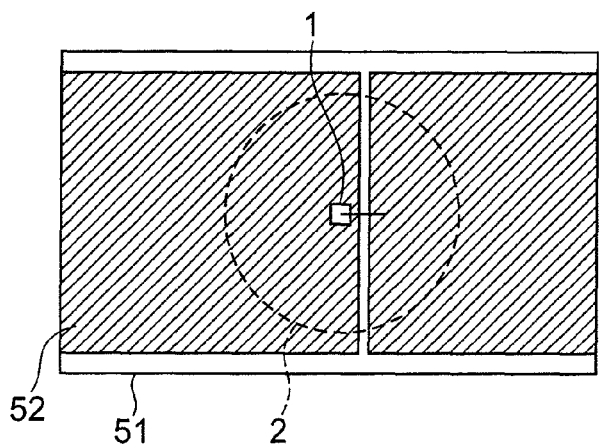
FIGS. 8A to 8C are plan views of examples of arrangements of a light-emitting diode and its peripheral members.
Figure 8B:
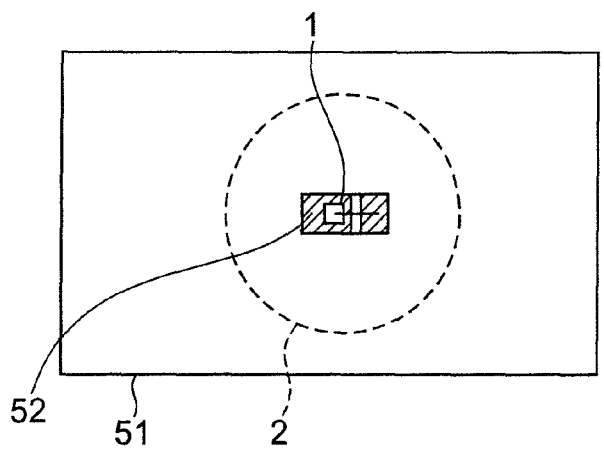
Figure 8C:
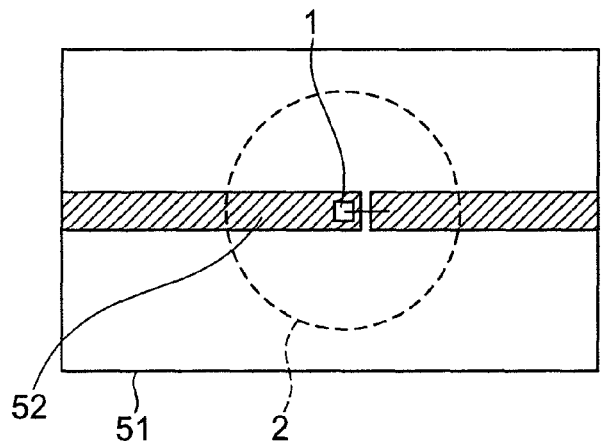

FIGS. 1 to 4, 5A to 5C, 6A, 6B, 7A, 7B and 8A to 8C are diagrams for illustrating this embodiment, in which FIG. 1 is a perspective view of an illumination device according to this embodiment, FIG. 2 is a crosssectional view taken along line A-A' in FIG. 1, FIG. 3 is an electric circuit diagram in connection with the illumination device, FIG. 4 is a crosssectional view of a sealing structure in which travel of light is illustrated, FIGS. 5A to 5C are plan views and crosssectional views illustrating examples of the shape of a high refraction index material member in a sealing structure, FIGS. 6A and 6B are diagrams of distribution of light intensity with respect to the emergent angle in which the light intensity distribution depends on the shape of a high refractive index transparent material member, FIGS. 7A and 7B are structural diagrams of examples of light-emitting diodes, and FIG. 8A to 8C are plan views of examples of arrangements of a light-emitting diode and its peripheral members.

In FIG. 1, an illumination device 100 according to this embodiment has a plurality of sealing structures 10 in a two-dimensional and regular arrangement.

Referring to FIG. 2, each of the sealing structures 10 has a light-emitting diode 1 mounted on a wiring conductor 52 formed on a substrate 51, and the diode 1 so mounted is sealed by a transparent material member 2 having a high refractive index (a high refractive index transparent material member) and the material member 2 is further sealed by a transparent material member 3 having a low refractive index (a low refractive index transparent material member). The light-emitting diode 1 in each sealing structure is electrically connected with the wiring conductor 52 with Ag paste 53 interposed therebetween. Further, the diode 1 is electrically connected with the wiring conductor 52 through a gold wire 54.

The illumination device in this embodiment may be manufactured in a process as described below.

First, a substrate 51 having on one of its surface a patterned conductor 52 is prepared and light-emitting diodes 1 are mounted at predetermined positions on the patterned conductor or wiring conductor 52. Namely, Ag paste 53 is coated on the wiring conductor 52, light-emitting diodes 1 are disposed on the Ag paste 53, the Ag paste is thermally hardened, and wire-bonding is carried with out with gold wires for connection between the diodes 1 and the wiring conductor 52. Next, a high refractive index transparent material 2 is potted and hardened, and a low refractive index transparent material 3 is disposed thereon and hardened for sealing the material 2 therewith. At this time, if the gold wires 54 extend, not only in the high refractive index transparent material 2, but also to the low refractive index transparent material 3, it is possible that the gold wires 54 may suffer disconnection or the like due to stress to which the gold wires 54 are subjected due to differences in the thermal expansion coefficients between the different materials. Therefore, it is preferable that the whole gold wires 54 should be sealed within the high refractive index transparent material members 2.

After the mounting and sealing steps, electric connection is made of the patterned conductor or the wiring conductor 52 to a power supply and to a control circuit (not shown) to complete the illumination device 100. For protection of the light-emitting diodes, a protective circuit including a zenor diode may be incorporated into the illumination device 100 or into the control circuit.

The light-emitting diodes 1 in the illumination device 100 shown in FIG. 1 are connected in series in the horizontal direction on the drawing sheet plane as shown by the electric circuit diagram in FIG. 3. The light-emitting diodes 1 operate to emit light with a predetermined voltage applied to the respective series connections in a forward direction. In the illustrated embodiment, each of the series-connections includes four light-emitting diodes connected in series and is connected to a power source and a control circuit. Thus, by controlling voltage, current, duration of voltage application and others, it possible to optionally vary the intensity of light to be emitted for each series connection line. Although the sealing structures are in a regular arrangement and the light-emitting diodes are connected in series in the horizontal direction in this embodiment, the arrangement of the sealing structures and the electric connection of the diodes may be optionally determined.

In the illumination device according to this embodiment, as shown in FIG. 4, each light-emitting diode 1 is covered by a high refractive index transparent material member 2. Although the light-emitting diode 1 is made of a compound semiconductor or a substrate having a high refractive index in the order of 1.8 to 3.5, the covering of the diode 1 by member 2 makes it possible to suppress the total reflection of light from the diode 1 at the interface between the diode 1 and the high refractive index transparent material member 2 so that light from the diode 1 can be efficiently extracted or conducted to the member 2. The high refractive index transparent material member 2 is further covered by a low refractive index transparent material member 3.

Assuming here that $n_1$ represents the refractive index of the high refractive index transparent material member 2 and $n_2$ represents the refractive index of the low refractive index transparent material member 3, when light 5 emitted by the light-emitting diode 1 travels in the high refractive index transparent material member 2 to be incident on the low refractive index transparent material member 3 with an incident angle larger than $\theta=\sin^{-1}(n_2/n_1)$, the light 5 will undergo the total reflection at the interface between the members 2 and 3. Light 5, after the total reflection, travels toward the light-emitting diode 1 (downward on the drawing sheet plane). In the illumination device of this embodiment, assuming that H represents the thickness of the high refractive index transparent material member 2 measured at the central portion of an upper surface of the light-emitting diode 1 and L represents the width of the upper surface of the light-emitting diode 1, the following relation stands: $H>(L/2)/\tan \theta$. Since $\theta=\sin^{-1}(n_2/n_1)$, this yields $H>(L/2)/\tan \{\sin^{-1}(n_2/n_1)\}$.

In the illumination device of this embodiment having a structure satisfying the above-mentioned inequality, even light 5 emerging from an end portion of the light-emitting diode 1, traveling in the high refractive index transparent material member 2 to be incident on the interface between the high refractive index transparent material member 2 and the low refractive index transparent material member 3 at a critical angle θ and having undergone the total reflection thereat reaches the substrate 51 and the wiring conductor 52, without coming back to the light-emitting diode 1 for absorption thereby. Light 5 further undergoes the total reflection repeatedly on the substrate 51 and the wiring conductor 52 and at the interface between the high refractive index transparent material member 2 and the low refractive index transparent material member 3 to finally pass through the interface at the peripheral portion of the member 2 and through the member 3 for external emanation.

In this way, in the illumination device of this embodiment, light from the light-emitting diodes is efficiently extracted and the extracted light is dispersed widely to the peripheral portions of the transparent material members, which means that the divergence angle of a light source is substantially made larger. Thus, the illumination device enjoys a high light extraction efficiency and a high uniformity of light intensity on an illumination plane.

For example, when the high refractive index transparent material member 2 has a refractive index $n_1=1.75$ and the low refractive index transparent material member 3 has a refractive index $n_2=1.4$, and the upper surface of the light-emitting diode 1 has a width L=300 μm, the high refractive index transparent material member 3 is formed so as to have a thickness H>113 μm. With this structure, light emitted from an end portion of the light-emitting diode 1 and incident on the interface at an angle not smaller than a critical angle of 53 degrees undergoes the total reflection and reaches the substrate 1 or the wiring conductor 52, without being incident back on the light-emitting diode 1.

Further, with the illumination device of this embodiment having the high refractive index transparent material member 2 having such specific shape, it is possible to apparently augment the size of a light source and to optionally control the direction and/or the magnitude of the divergence angle of the light source by properly determining the shape of the high refractive index transparent material member 2.

FIGS. 5A to 5C are plan views illustrating examples of a light-emitting diode serving as a light source and an arrangement of members in its periphery and crosssectional views taken vertically and horizontally on the plan views. Here, the low refractive index transparent material member 3 is omitted for convenience sake of explanation.

In FIG. 5A, the high refractive index transparent material member 2 has a shape which is point-symmetrical with respect to the light-emitting diode 1, with the members 2 and 3 and the diode 1 being prepared to satisfy the above-mentioned relation: $H>(L/2)/\tan\{\sin^{-1}(n_2/n_1)\}$. The illumination device shown in FIG. 5A is effective in equally spreading or dispersing emitted light in all directions. Meanwhile, when the high refractive material member 2 is asymmetrical, as shown in FIGS. 5B and 5C, with the above-mentioned relation being satisfied, the effect of spreading or dispersing emitted light is different depending on the directions.

In FIG. 5B, the high refractive index transparent material member 2 is in a semi-spheroidal shape, that is, the member 2 is relatively longer in the x-direction (horizontal direction on the plan view of FIGS. 5A~5C) and is relatively shorter in the y-direction (vertital direction on the plan view of FIGS. 5A~5C). The illumination device shown in FIG. 5B is effective in spreading or dispersing emitted light in the x-direction and gathering emitted light in the y-direction.

FIGS. 6A and 6B show examples of distribution of light intensity with respect to the light emergent angle. In FIG. 6A showing an example of light intensity distribution with respect to the emergent angle taken on a plane crossing the substrate perpendicularly and in the x direction, a first peak appears at 0 degree in the directly upward direction of emission where no total reflection takes place, and a second peak appears at an angle a little smaller than 90 degrees because of light dispersion due to the total reflection. On the other hand, in FIG. 6B showing an example of light intensity distribution with respect to the emergent angle taken on a plane crossing the substrate perpendicularly and in the y direction, a peak appears at 0 degree in the directly upward direction of emission, and the light intensity decreases with an increase of the angle.

As described, by making anisotropic the shape of the high refractive index transparent material member, it is possible to provide an illumination device capable of dispersing emitted light in the horizontal direction and capable of gathering emitted light in the vertical direction.

For example, when illumination devices of the structure shown in FIG. 5B are sued to constitute a backlight source in a display device according to Embodiment 6, which will be described later with reference to FIG. 19, emitted light will be dispersed or spread in the x direction in which a wide angle of view is required, while emitted light is less dispersed or spread in the y direction in which the angle of view need not be so wide, with a result that emitted light is effectively used.

In FIG. 5C, the high refractive index transparent material member 2 is relatively longer in the x direction and has a flat upper surface, i.e., the upper surface of the member 2 is flat as viewed in the x and y directions. With this structure, the light intensity distribution with respect to the emergent angle in the x direction is not so different from that in the y direction. However, the angular range in which the structure is substantially considered as a light source is relatively wide in the x direction and is relatively narrow in the y direction. Therefore, when illumination devices of the structure shown in FIG. 5C are used to constitute a backlight source of a display device, the illumination devices or sealing structures are arranged with a relatively large interval in the x direction and with a relatively smaller interval in the y direction, thereby expecting a uniform light intensity on an illumination plane.

The members which are essential to constitute illumination devices according to embodiments of the present invention and arrangements associated therewith will now be described.

The color of light emitted by the light-emitting diode 1 is variable by means of the compositions, arrangement and manufacturing process of semiconductor layers forming the light-emitting diode. The light color may be any one selected from those in the whole visible light wavelength region. Additionally, a combined use of light-emitting diodes capable of emitting light of different colors for mixture will make it possible to provide emitted light of an optional color. For example, a mixture of red, green and blue light radiations will provide white light.

Further, a fluorescent material may be disposed to surround the light-emitting diode so that light emitted by the diode, blue light for example, and light emitted by the fluorescent material, yellow light for example, are mixed to provide white light, or alternately, ultraviolet light emitted by the light-emitting diode may be used to excite the fluorescent materials to emit red light, green light and blue light to eventually obtain white light. These measures should be properly selected and combined in consideration of the uses of the illumination devices.

The light-emitting diode is mounted in different manners depending on the arrangement of its anode and cathode. Other than the light-emitting diode shown in FIG. 2 in which one electrode is formed on each of the upper and lower surfaces of the diode, it may have both an anode and a cathode on its upper surface, as shown in FIG. 7A, or it may have both an anode and a cathode on its lower surface, as shown in FIG. 7B. The light-emitting diodes as shown in FIGS. 7A and 7B may also be used to constitute illumination devices according to the teaching of the present invention. In each of the structures of the diodes, electrical connection to the electrode on the upper surface of the diode is carried out by means of wire bonding or wedge bonding, while electrical connection to the electrode on the lower surface of the diode is carried out by means of bump bonding, paste bonding, solder bonding, thermocompression bonding or ultrasonic compression bonding. One or some of these bonding techniques are employed depending on the heat resistant capability of the electrodes of the light-emitting diodes, and on metallizing of wiring and the substrate.

When the light-emitting diode has electrodes arranged as shown in FIG. 2 or 7B, the lower surface of the diode is also required to have electric conductivity for electrical connection with the wiring. Further, the number of electrodes is different if the size or kind of the light-emitting diode is different. A diode having two or more electrodes may be used. As for the size of the diodes to be used, although it may be optionally selected, those having a size of 0.1 mm square to 1 mm square will be most readily available and will be easy to employ. Generally, however, light-emitting diodes having any electrode arrangement or any size may be employed in embodiments of the present invention.

Preferably, the materials of the high refractive index transparent material member 2 and of the low refractive index transparent material member 3 have characteristics of high transmissivity, heat resistance, light-resistance (UV-resistance), low moisture permeability, high adhesivity and/or being free from cracks. Further, from the viewpoint of light extraction from the light-emitting diode, the high refractive index transparent material should preferably have a high refractive index which is as close as possible to that of a substrate or a compound semiconductor constituting the light-emitting diode. As for the low refractive index transparent material, it may be a material having a refractive index between that of air, i.e., unity (n=1), and that of the high refractive index transparent material. The high refractive index transparent material may be an epoxy resin, acrylic resin, a silicone resin, or a mixture of these resins having a relatively high refractive index.

From the viewpoint of light extraction from a light-emitting diode, it is preferable that the refractive index of the high refractive index transparent material is as high as possible. Practically, however, it may be difficult to obtain a reliable material consisting of a sole resin and having a refractive index higher than n=1.6. In that case, it will be possible to obtain an intended material by mixing transparent fine particles having a high refractive index with such resin used as a base material. As the high refractive index particles, titanium oxide, zirconium oxide, zinc oxide, other oxides or diamond may be used. The particle diameter should be such that light scattering is almost negligible, namely, it is preferable to be in the order of the visible light wavelength or smaller. More preferably, it is not larger than 50 nm.

The low refractive index transparent material may be an epoxy resin, an acrylic resin, a silicone resin or a mixture of these resins having a relatively low refractive index.

These high and low refractive index transparent material members are disposed by dispensing, potting or dipping, and are hardened by thermosetting or UV-hardening or any other hardening steps. The size and shape of the transparent resin can be optionally designed in accordance with the design policy for the illumination device and various properties of the resin such as viscosity and thixotropy. When a high precision is required for the shape of the transparent members, injection molding by use of a metal mold, transfer molding, stamper molding, or molding by use of a UV-hardened resin and a transparent mold may be employed. Further, in the present embodiment, the shape of the low refractive index transparent material member is optional and is variable in accordance with the use of the illumination device. The low refractive index transparent material member may also control the divergence angle of the light radiation of the sealing structure.

Further, as another material of the high refractive index transparent material, an inorganic porous material added with a titania sol may be used. The pore diameter in the material should preferably be not larger than the light wavelength.

Such inorganic material may involve sulfates such as lithium sulfate, sodium sulfate, potassium sulfate, rubidium sulfate, magnesium sulfate and cesium sulfate. To obtain a porous inorganic material, an aqueous solution of such a sulfate is applied (for sealing), and then it is subjected to bumping at a temperature not lower than 100 degrees centigrade to drive out moisture therefrom. Alternately, when a silica sol is used for an inorganic material, it is heated to obtain an inorganic porous material.

To the resulting inorganic porous material, a titania sol is added or applied, and organic components in the titania sol are removed by heating or by hydrolysis, thereby obtaining a high refractive index transparent material. Although the titania sol may involve some difficulty in that it entails a large extent of volume compression at the time of removal of organic components therefrom, which may cause cracks or exfoliation, the porosity of the materials suppresses the extent of the suppression to avoid occurrence of cracks. Further, titanium oxide serves to decompose resins through photo-catalytic reactions, but influences of such decomposition can be avoided by covering the titanium oxide with one of the above-mentioned inorganic materials. Thus, it is possible to effectively use titanium oxide which has a refractive index as high as 2.6 or so.

The substrate 51 and wiring 52 may be prepared using a so-called printed wiring board, that is, a wiring conductor pattern is formed on a metal base of such as copper or aluminum with an insulating layer interposed therebetween. Alternately, a wiring substrate having a base of a glass-epoxy resin and a wiring pattern formed thereon may be used. Also, a so-called ceramic wiring substrate, that is, a wiring substrate having a ceramic base such as of aluminum nitride, silicon nitride or alumina and a wiring pattern formed thereon by printing, sputtering, vacuum evaporation or the like may be used. Other wiring substrate or board which may be used in the embodiments of the present invention includes a flexible wiring substrate having a resin base such as of polyimide and a wiring pattern formed thereon and a wiring substrate having a metal base and a wiring lead frame such as of Cu, a Cu alloy or a 4-2 alloy attached on the base interposing an insulating layer therebetween.

Those portions of the substrate 51 and the wiring 52 on which light-emitting diodes are mounted are sealed with transparent materials. Since light from the light-emitting diodes is incident on the wiring and the substrate, it is preferable that the substrate and the wiring should have a high reflectance.

When the wiring 52 has a reflectance higher than that of the substrate 51, particularly when the wiring is made of a high reflectance material, or is plated with a high reflectance material, or is formed by sputtering for enhancing its reflectance, it is preferable that the area of the high reflectance wiring 52 which is sealed by the high refractive index transparent material member 2 should be larger than that area of the substrate 51 which is not covered with the wiring 52 and is sealed by the member 2, as shown in FIG. 8A. For example, Ag, Pd, Sn, Au, Ni and the like are suited for the material of the wiring, for the material for plating the wiring and for the material to be sputtered for forming the wiring.

Meanwhile, when the substrate 51 has a reflectance higher than that of the wiring 52 due to the fact that the substrate 51 is made of a ceramic having a high reflectance or is coated with a white resist, it is preferable that the area of the high reflectance wiring 52 which is sealed by the high refractive index transparent material member 2 should be smaller than the area of the substrate 51 which is sealed by the member 2 so that the greater portion of the lower or bottom surface of the member 2 is contacted with the substrate 51. Particularly, when the substrate 51 is coated with a white resist, the wiring 52 may be in a pattern as shown in FIG. 8B, while when the substrate 51 is made of a ceramic, the wiring may be patterned as shown in FIG. 8C.

Since the emission efficiency of the light-emitting diode tends to decrease with an increase of the temperature, it is preferable to use a substrate and a wiring both having a high heat dissipation property.

Embodiment 2

Figure 9:
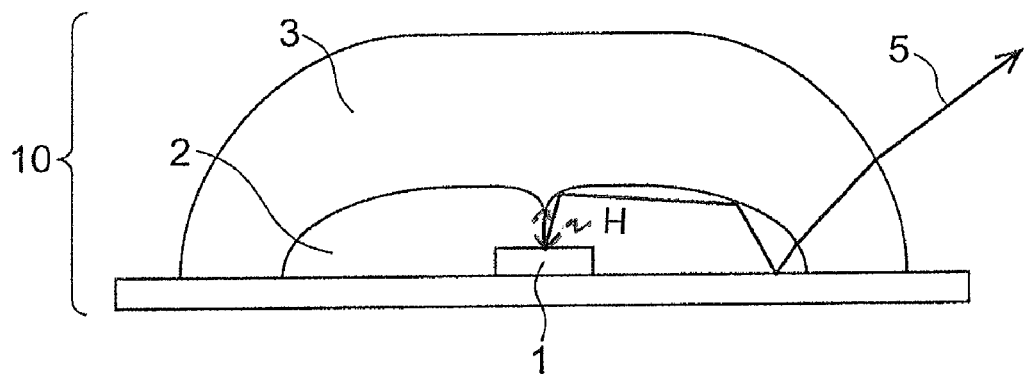
FIG. 9 is a crosssectional view of a sealing structure according to Embodiment 2 of the present invention in which travel of light is illustrated.

FIG. 9 is a crosssectional view of a sealing structure for an illumination device according to the second embodiment of the present invention. In this embodiment, a light-emitting diode 1 is sealed by a high refractive index transparent material member 2, which is further sealed by a low refractive index material transparent member 3, as in Embodiment 1. This embodiment is different from Embodiment 1 in that the portion of the high refractive index transparent material member 2 which covers the upper surface of the light emitting member 1 has a recess above the central portion of the upper surface of the light-emitting diode 1.

Light 5 emitted by the light-emitting diode 1 emanates efficiently from the sealing structure 10 due to the high refractive index transparent material member 2 sealing the diode 1. Light 5 emitted by the light-emitting diode 1 reaches the interface between the high and low refractive index transparent material members 2 and 3. It should be particularly noted that even when the light 5 is emitted generally upward, it is totally reflected at a slanting portion of the interface formed by the recess in the member 2 so that the light is deflected to travel generally in the horizontal direction to emanate from the sealing structure 10.

In other words, according to this embodiment, it is possible to efficiently extract light 5 from the light-emitting diode 1 and to disperse or spread light 5 to the peripheral portions of the transparent material members for emanation from the sealing structure 10. Therefore, the illumination device according to this embodiment enjoys a high efficiency of light extraction from the respective sealing structures and a high degree of uniformity of light intensity on an illumination plane.

Figure 10:
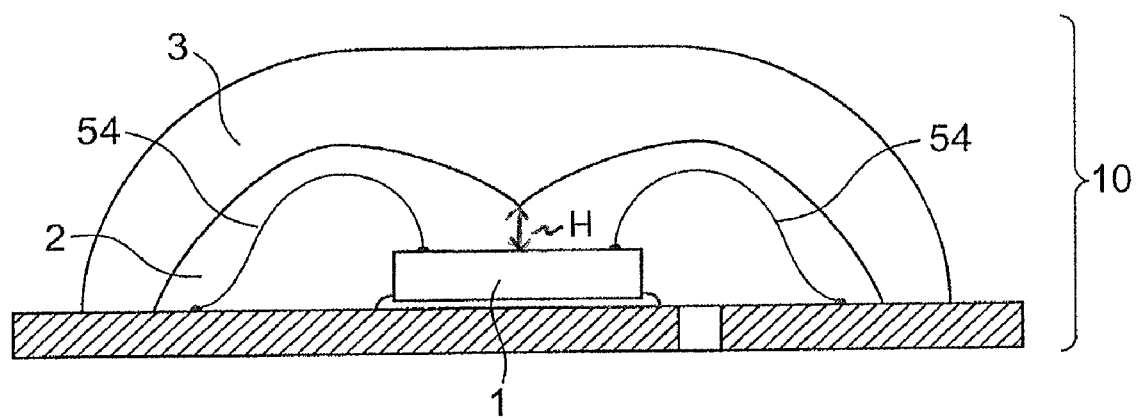
FIG. 10 is a crosssectional view of another sealing structure which may be employed in Embodiment 2.

The high refractive index transparent member 2 having a recess in this embodiment may be realized by use of a metal mold or the like. Further, as shown in FIG. 10, when the light-emitting diode 1 has a plurality of gold wires 54 connected therewith, in which the wires may often be in a loop-like shape, optimization of the viscosity and thixotropy of the high refractive index transparent material 2 and the height of the loop-like wires will make it possible to form in the member 2 a recess conforming to the shape of the wires, without resorting to the metal mold.

In this embodiment, the functional effect similar to that of the first embodiment can be attained not only in the case the shape of the sealing structure 10 is in a rotation-symmetry with respect to the light-emitting diode 1 to, but also in the case of an asymmetrical shape, although the degree of uniformity of light intensity may be different depending on the direction of light emanation.

Embodiment 3

Figure 11:
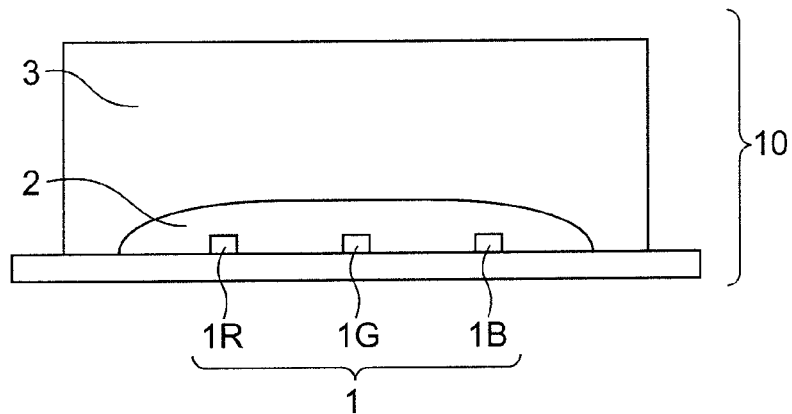
FIG. 11 is a crosssectional view of a sealing structure according to Embodiment 3 of the present invention.
Figure 12:
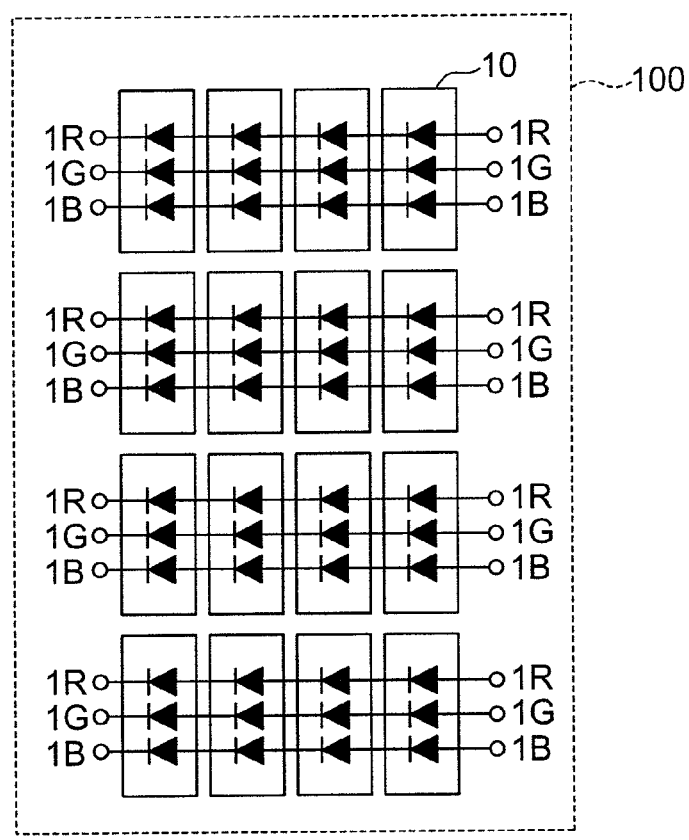
FIG. 12 an electric circuit diagram in connection with Embodiment 3.

FIG. 11 is a crosssectional view illustrating one sealing structure for an illumination device according to this embodiment, while FIG. 12 is an electric circuit diagram in connection with the illumination device. In this embodiment, as shown in FIG. 12, sealing structures 10 are arranged in four rows in the horizontal direction and in four columns in the vertical direction, that is, as is also shown in FIG. 1.

This embodiment is similar to Embodiment 1 or 2 except the technical matters in the explanation given below. The recess as in Embodiment 2 is not particularly shown. The distinguishable points in this embodiment are that a plurality of light-emitting diodes 1 are sealed by a high refractive index transparent material member 2 and the member 2 is further sealed by a low refractive index transparent material member 3 in each sealing structure 10.

In this embodiment, the low refractive index transparent material member 3 is formed in a cylindrical shape by injection molding. The light-emitting diodes in each sealing structure 10 include a light-emitting diode 1R capable of emitting light in a red wavelength region, a light-emitting diode 1G capable of emitting light in a green wavelength region and a light-emitting diode 1B capable of emitting light in a blue wavelength region. As shown in FIG. 12, the light-emitting diodes 1R, 1G and 1B in the respective sealing structures are in an electrical connection in such a manner that those emitting light of the same colors which are in sealing structures juxtaposed in the horizontal direction (as viewed on the drawing sheet) are connected in series.

In this embodiment, each sealing structure includes three light-emitting diodes capable of emitting light in red, green and blue, respectively, which are three primary colors of light. Therefore, with an illumination device incorporating such sealing structures, it is possible to optionally and controllably change the color of light to be emitted to any color including white by controlling current, application voltage, time duration of voltage application in each line. At this time, not only light can be efficiently extracted from the light-emitting diodes owing to the high refractive index transparent material members covering the diodes, but also each of red light, green light and blue light emitted by the light-emitting diodes in each sealing structure is totally reflected so as to travel in the horizontal direction for mixture in a satisfactory manner owing to the high refractive index transparent material member having such specific shape as described in connection with Embodiments 1 and 2. Further, the illumination device incorporating such sealing structures enjoys uniformity of light intensity between adjacent sealing structures as well.

It is further noted that, in this embodiment, light-emitting diodes are connected in such a manner that those capable of emitting light of the same color are connected to form a single series connection for each line. Consequently, when the illumination device including sealing structures in this embodiment is employed as a backlight source in a display device to be described later in connection with Embodiment 6, the light radiation timing and the light intensity can be controlled for each line in accordance with an image to be displayed, which leads to a high quality of displayed images.

Embodiment 4

Figure 13:
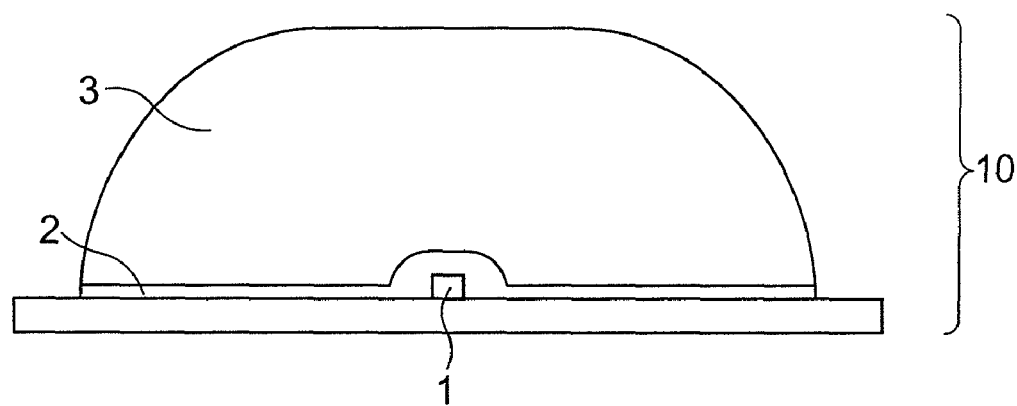
FIG. 13 a crosssectional view of a sealing structure according to Embodiment 4 of the present invention.
Figure 14:
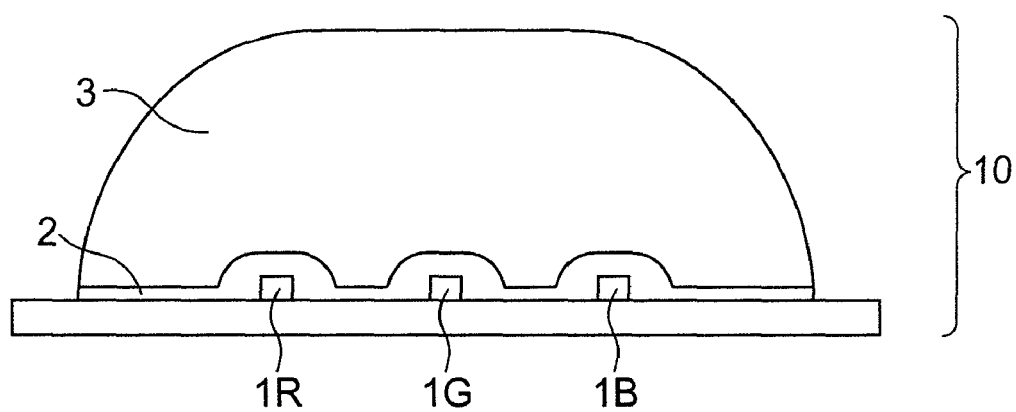
FIG. 14 is a crosssectional view of another sealing structure which may be employed in Embodiment 4.

FIGS. 13 and 14 are crosssectional views of examples of a sealing structure 10 according to this embodiment. In the structure shown in FIG. 13, the sealing structure 10 includes one light-emitting diode 1, while in the structure shown in FIG. 14, the sealing structure 10 includes light-emitting diodes 1R, 1G and 1B capable of emitting light in red, green and blue wavelength regions, respectively. This embodiment is similar to Embodiment 1, 2 or 3 except the technical matters in the explanation given below. The recess as in Embodiment 2 is not particularly shown.

In this embodiment, the level of the upper surface of the high refractive index transparent material member 2 is not uniform, that is, the levels of the portions of the upper surface of the member 2 which overlie the light-emitting diodes 1 are higher than the levels of the other portions of the upper surface of the member 2.

This embodiment also enjoys similar functional effect to that of the embodiments described above, that is, the light extraction efficiency is high and the light intensity is uniform. In addition, since the each light-emitting diode 1R, 1G and 1B is individually covered thick, an amount of the high refractive index transparent material needed to form the refractive index material transparent member 2 can be reduced as compared to the structure shown in FIG. 11 where the light-emitting diodes 1R, 1G and 1B are collectively covered with one high refractive index transparent material member, which leads to a cost reduction.

So long as the level of that portion of the upper surface of the high refractive index transparent member 2 which overlies the light-emitting diode 1 is higher than the levels of the other portions of the upper surface of the member 2 in a sealing structure, even when the high refractive index transparent material member 2 does not have a shape which satisfies the conditions described in connection with Embodiments 1 or 2, an illumination device employing such sealing structures will enjoy a high uniformity of light intensity, although the light extracting efficiency may be smaller. Further, since the each light-emitting diode 1R, 1G and 1B is covered individually thick, the degree of color mixture of individual light radiations from the diodes is advantageously enhanced.

In this embodiment, the shape of the high refractive index transparent material members 2 may be attained by use of a metal mold via injection molding, or otherwise, optimization of the viscosity and thixotropy of the high refractive index transparent material and of the height of the loop-like bonding wires makes it possible to realize the shape of the member 2, without resorting to the use of a metal mold.

Embodiment 5

Figure 15:
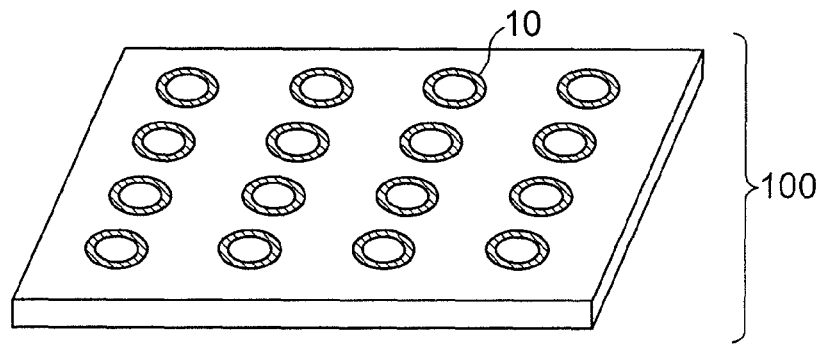
FIG. 15 is a perspective view of an illumination device according to Embodiment 5 of the present invention.
Figure 16:
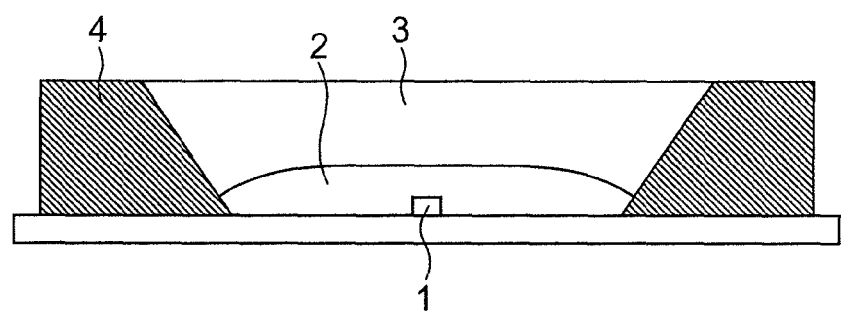
FIG. 16 is a crosssectional view of an example of a sealing structure in Embodiment 5.
Figure 17:
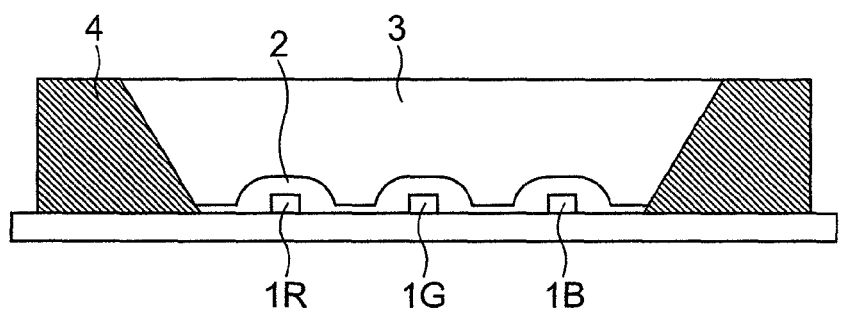
FIG. 17 is a crosssectional view of another example of a sealing structure which may be employed in Embodiment 5.

FIG. 15 is a perspective view of an illumination device according to this embodiment, while FIGS. 16 and 17 are crosssectional views of examples of sealing structures in this embodiment. As shown in FIG. 15, an illumination device 100 has an array of sealing structures 10. In FIG. 16, each of the sealing structures 10 has a light-emitting diode 1, a high refractive index transparent material member 2 sealing the diode 1 and a low refractive index transparent material member 3 sealing the member 2.

In this embodiment, a reflective member 4 is further provided at the peripheries of the high and low refractive index transparent material members 2 and 3. The high refractive index transparent material member 2 surrounded by the reflective member 4 may be similar in shape to that described in connection with any one of the above embodiments. When the member 2 has a shape such as in Embodiment 4 shown in FIG. 14, the resulting sealing structure may be as shown in FIG. 17, in which a light-emitting diode 1R capable of emitting light in a red wavelength region, a light-emitting diode 1G capable of emitting light in a green wavelength region and a light-emitting diode 1B capable of emitting light in a blue wavelength region are provided, and the level of the portion of the upper surface of the high refractive index transparent member 2 which overlies each diode is higher than the levels of the other portions of the upper surface of the member 2.

This embodiment provides, like the above-described embodiments, can provides low cost illumination devices in which light is extracted from light-emitting diodes efficiently, the extracted light radiations have a uniform light intensity, and the amount of consumption of the high refractive index transparent material is small.

According to this embodiment, when the high and low refractive index transparent materials 2 and 3 are disposed on the substrate for sealing, the reflective member 4 suppresses lateral expansion of the materials, the shape for the materials can be readily controlled through the means such as potting or dispensing to advantage.

Preferably, the reflective member 4 should be made of a material which is heat resistant, light-resistant (UV-resistant), low in moisture permeability, highly adhesive, and/or free from cracks. If the member 4 is made of a resin, it should be formed by transfer molding or injection molding.

The resin which the reflective member is made of may be, in addition to a resin which is white itself, a resin to which a white pigment or white particles are added to obtain a high reflectance, a resin having many minute pores therein so that multiple reflection takes place at the interfaces at the pores, a resin member to which a metal film having a high reflectance is applied by means such as vacuum evaporation, sputtering or printing or a resin member which has a dielectric multi-layer film applied to its surface for reflection to thereby increase the reflectance of the resin member. Particularly when the surface of the reflective member is made free from unevenness, the reflective member will provide a so-called mirror surface. Aside from the resins, the reflective member may be made by sintering a ceramic such as alumina. The reflective member thus prepared may be applied to the substrate after the wiring has been formed or after the light-emitting diodes have been mounted. Thereafter, various sealing steps are to be carried out.

Figure 18A:
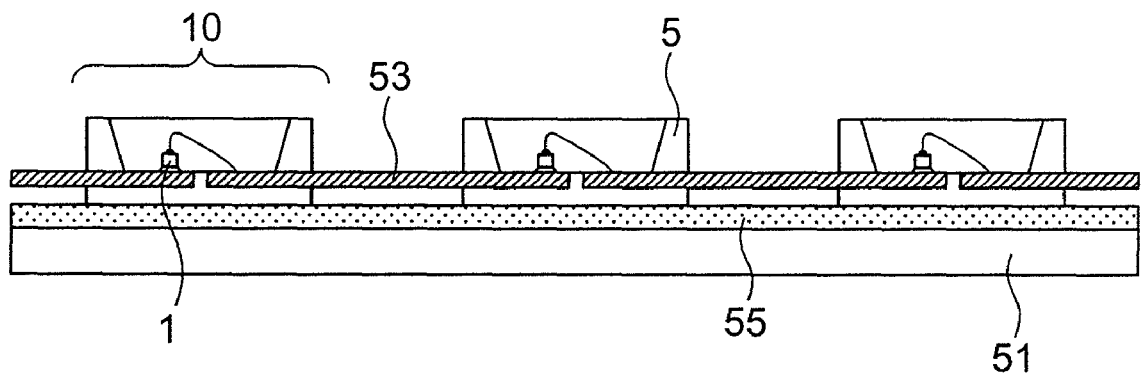
FIGS. 18A and 18B are crosssectional and plan views of still another example of a sealing structure which may be employed in Embodiment 5.
Figure 18B:
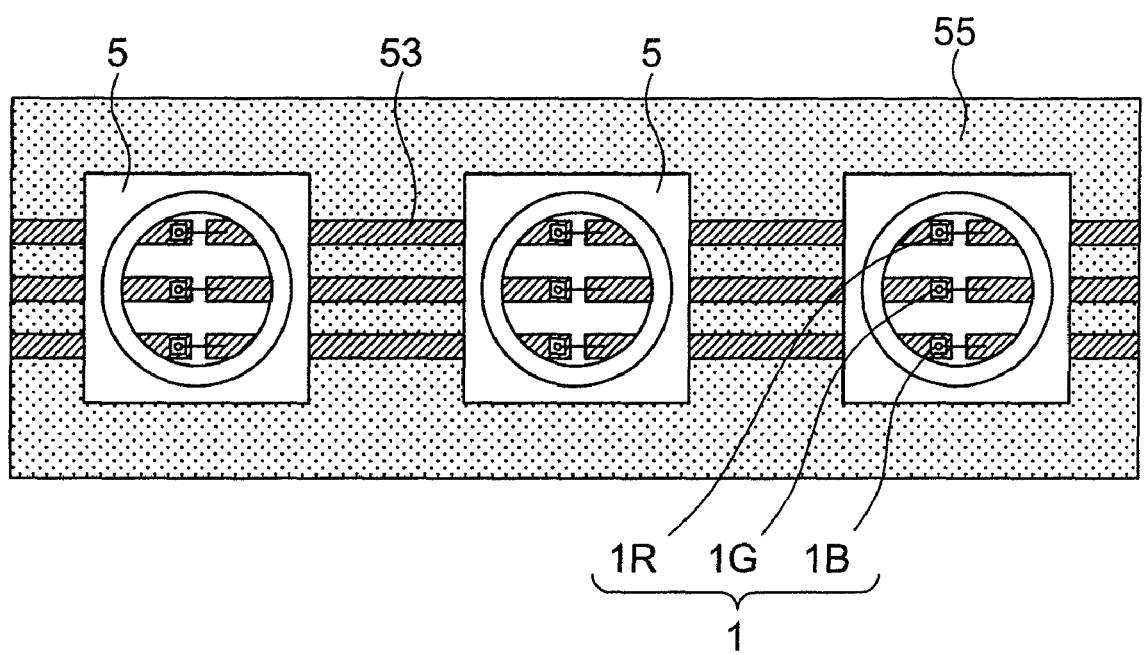

When lead frames are used for electrical connection, an assembly of pre-molds may first be prepared, as shown in FIGS. 18A and 18B, in which reflective members 4 are integrally molded along with lead frames 53 in advance. Then, with the assembly of pre-moldes, light-emitting diodes 1 are mounted in place and sealing steps are carried out. The resulting arrangement is bonded to a substrate 51 through an insulating layer. FIGS. 18A and 18B show a sealing structure in an illumination device according to this embodiment in a crosscrosssectional view and in a plan view, respectively. When the light-emitting diodes 1 in a plurality of sealing structures are connected in series, the pre-molds 5 may be electrically connected with trains of lead frames, and the connected sealing structures are bonded to the substrate 51 through an adhesive layer 55 to thereby complete the illumination device easily.

Embodiment 6

Figure 19:
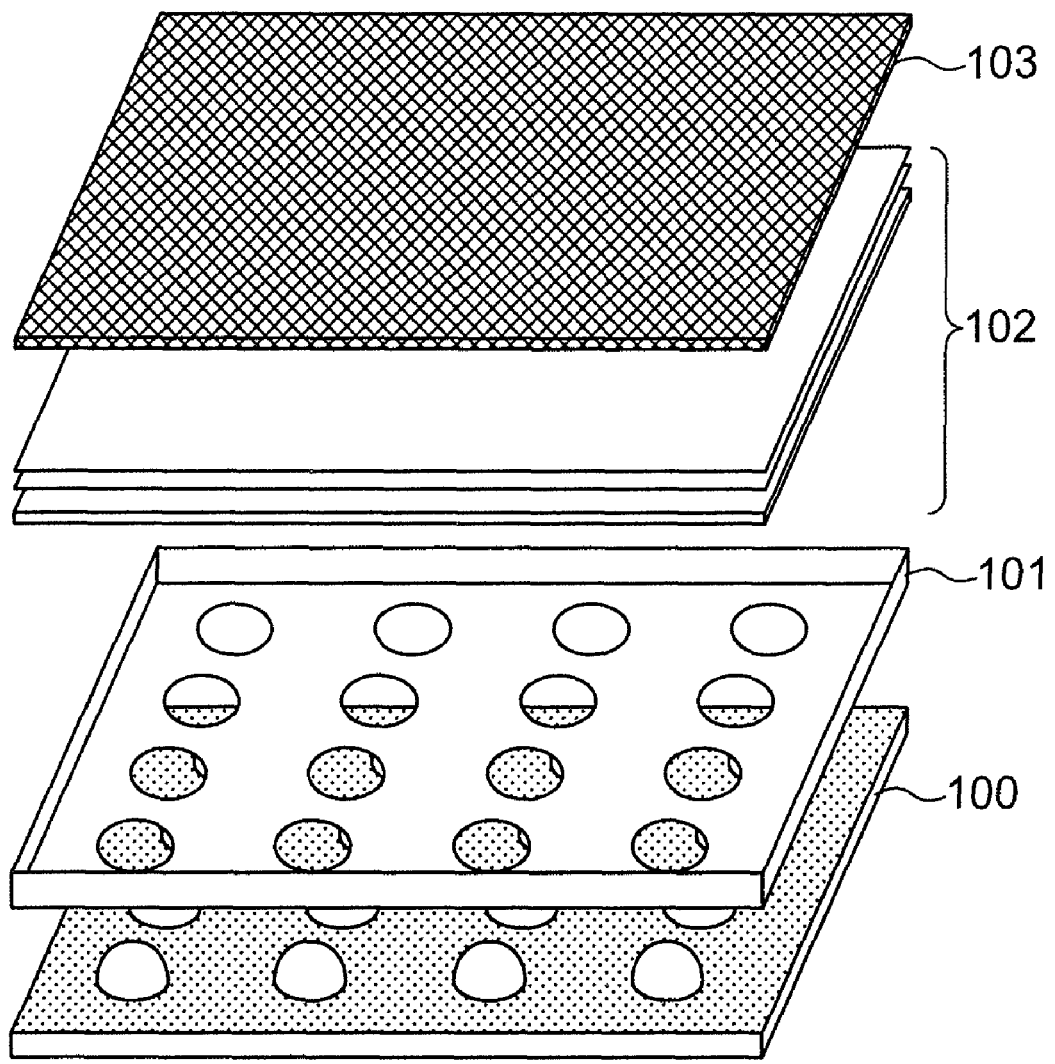
FIG. 19 is a perspective view of a display device according to Embodiment 6 of the present invention.

FIG. 19 is a perspective view of a display device according to this embodiment. The display device includes an illumination device assembly 100 having one illumination device or an array of illumination devices described in the above embodiments, a reflector sheet 101 for reflecting light from the illumination device assembly 100 to an optical element assembly 102, the optical element assembly 102 serving to further make uniform reflection light from the reflector sheet 101 and light from the illumination device assembly 100 and to control light radiation direction, and a non-luminous display panel 103 for controlling light transmission.

The reflector sheet 101 has openings at portions corresponding to sealing structures 10 of the illumination assembly 100 and functions to reflect light, which is returned by reflection from the optical element assembly 102 toward the illumination assembly 100, back toward the non-luminous display panel 103.

By properly controlling the light transmission, that is, turning on or turning off light from the illumination device assembly 100 on the rear side of the non-luminous display panel 103 for the respective picture elements, it is possible to display images and/or characters on the panel 103.

The non-luminous panel 103 in this embodiment may be operative in any display mode such as a liquid crystal display mode, an electrophoresis display mode, an electrochromic display mode, a charged particle fluid display mode, a transmission type display mode in which the panel itself does not emit light. The optical element assembly 102 may be constituted by one of or a combination of two or more of a diffusion plate, a reflecting plate, a light conduction plate, a prism sheet and a polarized reflection diffusion sheet thereby to provide an optional light radiation direction and uniformity of light intensity.

The display device of this embodiment which utilizes, as its backlight source, one or more illumination devices such as those according to the above embodiments which enjoy a high light extraction efficiency and a high uniformity of light intensity on an illumination plane as described above, also has a high efficiency in the light extraction and a high uniformity of light intensity. Further, by taking advantage of the high uniformity of light intensity, it is possible to decrease the thickness of a resulting backlight source, and hence, the total thickness of the display device.

Further, with the illumination devices according to the above-described embodiments, since the direction of light emanation is controllable, it is possible to broaden the light radiation angle in the horizontal direction in which a wide angle of view is required and to suppress the light radiation angle in the vertical direction in which the angle of view need not be so wide, whereby effective use of emitted light is possible. Further, the number of optical sheets such as prism sheets, which are responsible for this functional effect, can be reduced for cost reduction.

Furthermore, since the light-emitting diodes are capable of on-off operations at high speeds as compared to the fluorescent lamps used to constitute the conventional backlight source, they contribute to enhancement of the picture quality such as of moving pictures and the contrast. Also, the light-emitting diodes in the illumination device may be driven in such a manner that the light-emitting diodes arranged in the horizontal direction are sequentially lighted for each column or for each color of emitted light in synchronism with a picture signal for the non-luminous display panel 103. Specifically, when the illumination device in the display device has a backlight source constituted by red, green and blue light-emitting diodes, the display device is capable of a broader range of color reproduction to provide very vivid pictures as compared to those having the conventional backlight source which makes use of the fluorescent lamps. Further, the light-emitting diodes, being free from mercury, are friendly to the environment to advantage.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An illumination device having a plurality of sealing structures, each of said sealing structures including at least one light-emitting diode mounted on a wiring conductor formed on a substrate, a high refractive index transparent material member sealing said light-emitting diode and a low refractive index transparent material member sealing said high refractive index transparent material member, wherein said high refractive index transparent material member which covers an upper surface of said light-emitting diode has a recess in an upper surface on an opposite side of said substrate and serves to increase a divergence angle of light radiation from said light-emitting diode, and wherein said high refractive index transparent material member is structured so as to satisfy a relation $H>(L/2)/\tan\{(\sin^{-1}(n_2/n_1)\}$, where H represents a thickness of said high refractive index transparent material member measured at a central portion of the upper surface of said light emitting diode to a bottom of the recess, L represents a length of one side of said upper surface of said light emitting diode, $n_1$ represents a refractive index of said high refractive index transparent material member and $n_2$ represents a refractive index of said low refractive index transparent material member.

2. An illumination device according to claim 1, wherein said high refractive index transparent material member has a length in a horizontal direction larger than a length in another direction.

3. An illumination device according to claim 1, wherein said light-emitting diode includes at least one selected from a light-emitting diode capable of emitting light in a red wavelength region, a light-emitting diode capable of emitting light in a green wavelength region and a light-emitting diode capable of emitting light in a blue wavelength region.

4. An illumination device according to claim 1, wherein said light-emitting diode sealed by the high refractive index transparent material includes at least two light-emitting diodes selected from a light-emitting diode capable of emitting light in a red wavelength region, a light-emitting diode capable of emitting light in a green wavelength region and a light-emitting diode capable of emitting light in a blue wavelength region.

5. An illumination device according to claim 4, wherein upper surfaces of the portions of high refractive index transparent material member on said at least two light-emitting diodes have levels higher than the levels of other portions of said high refractive index transparent material member.

6. An illumination device according to claim 1, wherein said light-emitting diode is electrically connected with said wiring conductor through a wire, said wire being sealed in said high refractive index transparent material member.

7. An illumination device according to claim 1, wherein a reflective member is provided at a periphery of each of said sealing structures.

8. An illumination device according to claim 1, wherein said high refractive index transparent material member is made of a transparent resin into which transparent particles having a reflective index higher than that of said transparent resin are dispersed, said transparent particles having a size not larger than a visible light wavelength.

9. An illumination device according to claim 1, wherein said high refractive index transparent material member is made of a porous inorganic material into which a titania sol is dispersed.

10. An illumination device according to claim 1, wherein said light-emitting diode is in an electrical connection via said wiring conductor formed on said substrate, said wiring conductor having a reflectance higher than that of said substrate, the area of said wiring conductor which is sealed by said high refractive index transparent material member is larger than the area of said substrate which is not covered by said wiring conductor and sealed by said high refractive index transparent material member.

11. An illumination device according to claim 1, wherein said light-emitting diode is in an electrical connection via said wiring conductor formed on said substrate, said wiring conductor having a reflectance lower than that of said substrate, the area of said wiring conductor which is sealed by said high refractive index transparent material member is smaller than the area of said substrate which is not covered by said wiring conductor and sealed by said high refractive index transparent material member.

12. An illumination device according to claim 1, wherein said plurality of sealing structures are generally arranged in a two-dimensional array, and light-emitting diodes which are adjacent in a horizontal direction and are capable of emitting light of same color are connected in series with one another.

13. An illumination device according to claim 1, wherein said low refractive index transparent material member has a protrusion in a lower surface on a side of said substrate.

14. A display device comprising: a backlight source,
an optical element assembly for controlling uniformity of the intensity of light from said backlight source and divergence of radiation of light from said backlight source, and
a non-luminous display panel for controlling transmission of light with respect to each picture element,
wherein said backlight source has a plurality of sealing structures, each of said sealing structures including at least one light-emitting diode mounted on a wiring conductor formed on a substrate, a high refractive index transparent material member sealing said light-emitting diode and a low refractive index transparent material member sealing said high refractive index transparent material member, and
wherein said high refractive index transparent material member which covers an upper surface of said light-emitting diode has a recess in an upper surface on an opposite side of said substrate and serves to increase a divergence angle of light radiation from said light-emitting diode, and
wherein said high refractive index transparent material member is structured so as to satisfy a relation $H>(L/2)/\tan\{(\sin^{-1}(n_2/n_1)\}$, where H represents a thickness of said high refractive index transparent material member measured at a central portion of the upper surface of said light-emitting diode to a bottom of the recess, L represents a length of one side of said upper surface of said light-emitting diode, $n_1$ represents a refractive index of said high refractive index transparent material member and $n_2$ represents a refractive index of said low refractive index transparent material member, thereby enhancing uniformity of light emanating from said sealing structure.

15. A display device according to claim 14, wherein said sealed light-emitting diode includes at least two light-emitting diodes selected from a light-emitting diode capable of emitting light in a red wavelength region, a light-emitting diode capable of emitting light in a green wavelength region and a light-emitting diode capable of emitting light in a blue wavelength region, and light radiations from said at least two light-emitting diodes are mixed by being sealed by said high refractive index transparent material.

16. A display device according to claim 14, wherein said low refractive index transparent material member has a protrusion in a lower surface on a side of said substrate.

* * * * *